(12) United States Patent
Meng

(10) Patent No.: US 8,564,733 B2
(45) Date of Patent: Oct. 22, 2013

(54) ELECTRICAL DEVICE HAVING LOW VOLTAGE DIFFERENTIAL SIGNALING CABLE AND LIQUID CRYSTAL DISPLAY MODULE USING THE CABLE

(75) Inventor: Lu-Qing Meng, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 150 days.

(21) Appl. No.: 13/340,593

(22) Filed: Dec. 29, 2011

(65) Prior Publication Data

US 2013/0002980 A1    Jan. 3, 2013

(30) Foreign Application Priority Data

Jun. 28, 2011   (CN) .......................... 2011 1 0176623

(51) Int. Cl.
*G02F 1/1333*   (2006.01)

(52) U.S. Cl.
USPC .......................................................... 349/59

(58) Field of Classification Search
USPC .......................................................... 349/59
See application file for complete search history.

(56) References Cited

U.S. PATENT DOCUMENTS

| 6,388,722 | B1 * | 5/2002 | Yoshii et al. | 349/62 |
| 8,000,093 | B2 * | 8/2011 | Kim et al. | 361/679.21 |
| 8,134,655 | B2 * | 3/2012 | Yang et al. | 349/58 |
| 8,363,416 | B2 * | 1/2013 | Miyazaki | 361/749 |

* cited by examiner

*Primary Examiner* — Timothy L Rude
(74) *Attorney, Agent, or Firm* — Altis & Wispro Law Group, Inc.

(57) ABSTRACT

An electrical device includes a circuit board and a metal shield. The circuit board includes an electric cable for transmitting LVDS signals. The metal shield covers the circuit board to shield electromagnetic interference occurring in the circuit board. The metal shield defines an opening facing the electric cable, with at least most of the electric cable exposed.

14 Claims, 3 Drawing Sheets

ELECTRICAL DEVICE HAVING LOW VOLTAGE DIFFERENTIAL SIGNALING CABLE AND LIQUID CRYSTAL DISPLAY MODULE USING THE CABLE

BACKGROUND

1. Field of the Disclosure

The present disclosure relates to electrical devices having signal lines, and more particularly to an electrical device having a cable for transmitting low voltage differential signaling (LVDS) signals.

2. Description of Related Art

LVDS is a low-power, low-noise, differential signaling technology for high-speed signal transmission. Optimized for point-to-point configurations in telecom equipment, datacom equipment, peripherals and displays, LVDS delivers the bandwidth necessary for driving large data rates across PCBs and cables. Moreover, LVDS also has the advantage of low electromagnetic interference (EMI), and is thus suitable for various electrical devices such as display screens, notebooks, personal digital assistants (PDAs), and the like.

However, noise problems and EMI problems may still occur with LVDS, and as a result some consumers may not be satisfied with the performance of their electrical device.

What is needed, therefore, is an electrical device which can overcome the described limitations.

BRIEF DESCRIPTION OF THE DRAWINGS

The components in the drawings are not necessarily drawn to scale, the emphasis instead placed upon clearly illustrating the principles of at least one embodiment. In the drawings, like reference numerals designate corresponding parts throughout the various views.

DETAILED DESCRIPTION

Reference will be made to the drawings to describe exemplary embodiments in detail.

In order to understand the reasons for noise and EMI in electrical devices such as a liquid crystal display (LCD) module, numerous and repeated tests and verifications have been performed. The empirical results show that the following matters, among others, are important.

Taking the LCD module as an example, the LCD module includes a liquid crystal panel for displaying images, a circuit board for driving the liquid crystal panel, and a metal shield attached to the rear side of the liquid crystal panel and covering the circuit board to shield the circuit board from electromagnetic radiation. When the LCD module is used to display images, the circuit board receives a multiplicity of transistor-transistor logic (TTL) signals, converts each TTL signal to an LVDS signal under a corresponding control signal, and transmits the LVDS signal to the liquid crystal panel via an LVDS interface of the circuit board, a flexible flat cable (FFC), and an LVDS interface of the liquid crystal panel. The LVDS signal is then converted back to the TTL signal in the liquid crystal panel, and all the TTL signals control the liquid crystal panel to display the images. However, typically, the metal shield can not absorb all the electromagnetic radiation generated by the circuit board, and some of the electromagnetic radiation not absorbed by the metal shield is reflected back. The reflected electromagnetic radiation may spread to the FFC, and the LVDS signals in the FFC are very prone to couple with other LVDS signals as a result. This unwanted coupling causes crosstalk in the FFC, whereby some of the LVDS signals are disrupted. In particular, the crosstalk causes noise in the LVDS signals. In addition, such noise may be amplified during signal processing, such as during the process of converting the LVDS signals to the TTL signals in the liquid crystal panel.

Thus, EMI and noise problems may occur when the LCD module is in use, and the display quality of the LCD module is reduced.

Figure 1:
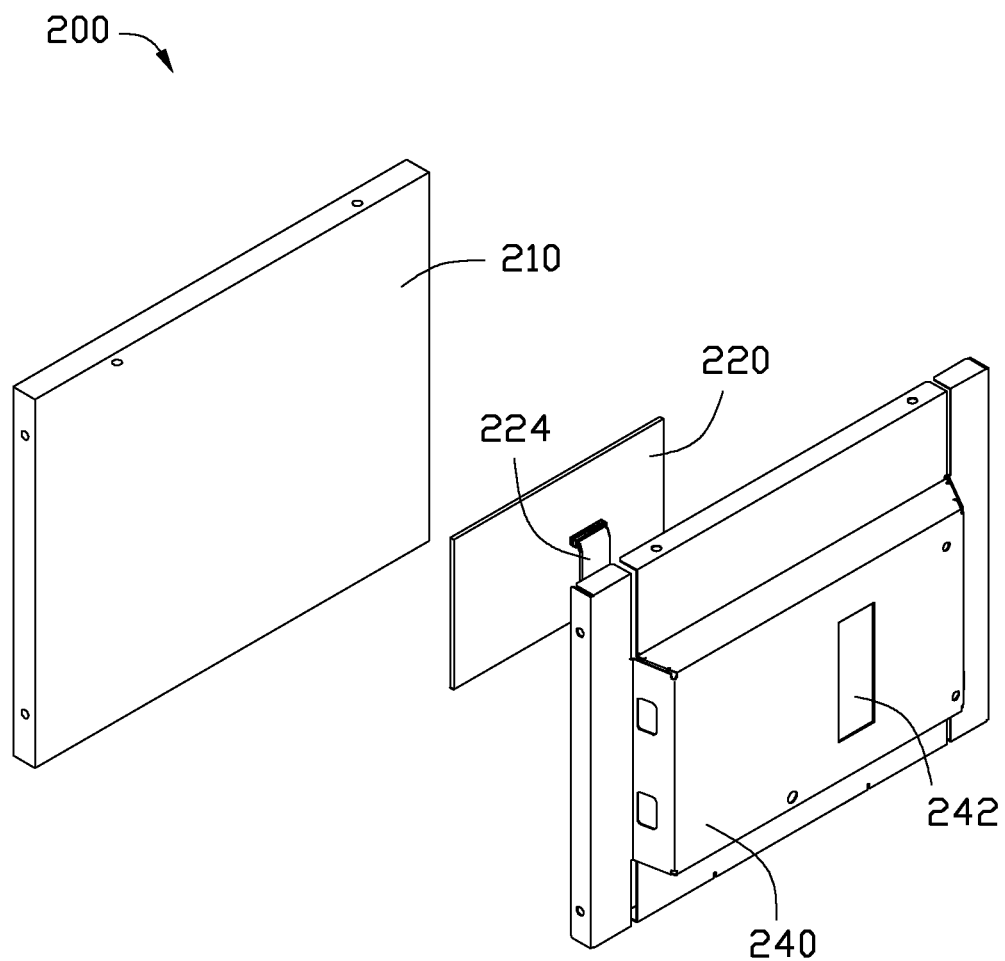
FIG. 1 is an exploded, isometric view of a liquid crystal display (LCD) module according to an exemplary embodiment of the present disclosure.
Figure 2:
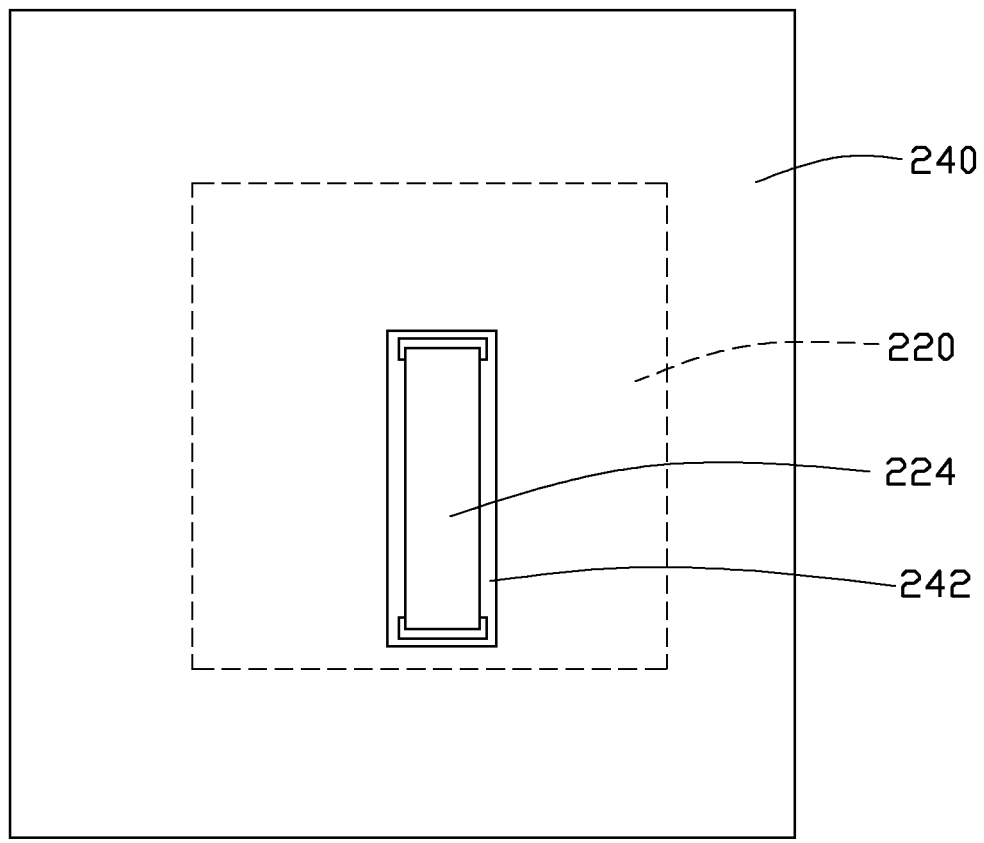
FIG. 2 is essentially a rear plan view of the LCD module of FIG. 1 when the LCD module is assembled.
Figure 3:
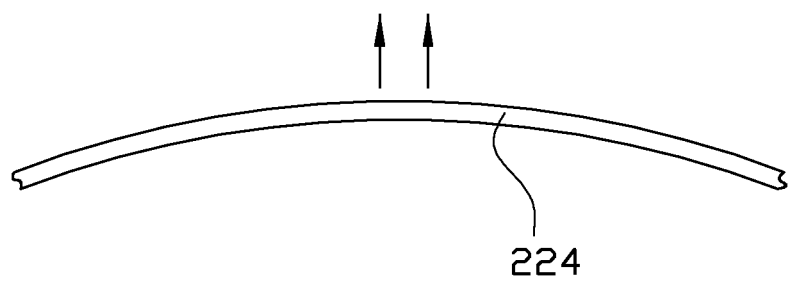
FIG. 3 is an enlarged, side plan view of part of a flexible flat cable (FFC) of the LCD module of FIG. 1.

Referring to FIG. 1 through FIG. 3, the LCD module 200 includes a liquid crystal panel 210, a circuit board 220 located at the rear side of the liquid crystal panel 210, a metal shield 240, and a frame (not labeled) accommodating the liquid crystal panel 210 and the metal shield 240.

The circuit board 220 is electrically connected to the liquid crystal panel 210. The circuit board 220 uses an electric cable 224 to transmit LVDS signals. In the illustrated embodiment, the electric cable 224 is an FFC 224. The FFC 224 is connected to an LVDS interface of the liquid crystal panel 210, so as to transmit the LVDS signals to the liquid crystal panel 210. The metal shield 240 covers the circuit board 220 to provide screening to reduce electromagnetic interference occurring in the circuit board 220. The metal shield 240 defines an opening 242 at a place facing the FFC 224 so as to expose most of the FFC 224, and the FFC 224 is visible from the outside of the metal shield 240 via the opening 242. In the illustrated embodiment, the opening 242 is approximately rectangular, and the size of the opening 242 is substantially the same as the size of the FFC 224. In various embodiments, the FFC 224 can for example be located adjacent to an inner surface of the metal shield 240 at the opening 242, or mostly received inside the opening 242, or partly or mostly protruding out from an outer surface of the metal shield 240. Also, the FFC 224 may have a substantially straight shape (as seen in FIG. 1), a bowed shape (as seen in FIG. 1), or another shape.

In use, when the LVDS signals are transmitted via the FFC 224, electromagnetic radiation may be generated by the FFC 224, and this electromagnetic radiation is typically weak and at a level which does not result in substantial or noticeable deterioration in the performance of the LCD module 200. The location of the FFC 224 corresponding to the opening 242 results in the electromagnetic radiation generated by the FFC 224 escaping in directions away from the metal shield 240 via the opening 242 (the arrows in FIG. 3 indicate the escaping direction of the electromagnetic radiation). As a result, little or no electromagnetic radiation is reflected by the metal shield 240 toward the FFC 224, and little or no crosstalk and noise are generated in the FFC 224. Accordingly, the display quality of the LCD module 200 is improved.

The LCD module 200 herein is not limited to the above-described embodiments. For example, the size of the opening 242 can be not equal to (i.e., smaller than, or larger than) the size of the FFC 224. When the size of the opening 242 is smaller than the size of the FFC 224, preferably, at least most of the FFC 224 is exposed from the metal shield 240. In another example, the opening 242 can be circular or elliptical. The shape of the opening 242 can be configured according to particular requirements.

The LCD module 200 may be in a notebook, an electronic book, an LCD TV (television), and the like.

The metal shield 240 with the opening 242 to solve the noise problem and EMI may be used not only in the LCD module 200, but also in other electrical devices having a metal shield to prevent noise and EMI problems.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A liquid crystal display (LCD) module, comprising:
a liquid crystal panel;
a circuit board electrically connected to the liquid crystal panel, the circuit board comprising an electric cable for transmitting low voltage differential signaling (LVDS) signals to the liquid crystal panel; and
a metal shield covering the circuit board to shield the circuit board from electromagnetic radiation;
wherein the metal shield defines an opening at a place facing the electric cable, with most of the electric cable exposed to an exterior of the metal shield.

2. The LCD module of claim 1, wherein the electric cable is a flexible flat cable (FFC).

3. The LCD module of claim 2, wherein the FFC has a rectangular profile, and the opening is rectangular.

4. The LCD module of claim 3, wherein the size of the opening is substantially the same as a corresponding size of the FFC.

5. The LCD module of claim 1, wherein the circuit board is configured to convert a transistor-transistor logic (TTL) signal to an LVDS signal under control of a corresponding control signal, and the electric cable is configured to transmit the LVDS signal to the liquid crystal panel.

6. An electrical device, comprising:
a circuit board comprising an electric cable for transmitting low voltage differential signaling (LVDS) signals; and
a metal shield covering the circuit board;
wherein the metal shield defines an opening facing the electric cable, with at least most of the electric cable exposed by the opening to an exterior of the metal shield.

7. The electrical device of claim 6, wherein the electric cable is a flexible flat cable (FFC).

8. The electrical device of claim 7, wherein the FFC has a rectangular profile, and the opening is rectangular.

9. The electrical device of claim 8, wherein the size of the opening is substantially the same as a corresponding size of the FFC.

10. A liquid crystal display (LCD) module, comprising:
a liquid crystal panel;
a circuit board electrically connected to the liquid crystal panel, the circuit board comprising an electric cable for transmitting low voltage differential signaling (LVDS) signals to the liquid crystal panel; and
a metal shield covering the circuit board to provide screening to reduce electromagnetic interference occurring in the circuit board;
wherein the metal shield defines an opening at a place corresponding to the electric cable, with at least most of the electric cable exposed at the opening and at least most of electromagnetic radiation generated by the electric cable escaping away from the metal shield via the opening.

11. The LCD module of claim 10, wherein the electric cable is a flexible flat cable (FFC).

12. The LCD module of claim 11, wherein the FFC has a rectangular profile, and the opening is rectangular.

13. The LCD module of claim 12, wherein the size of the opening is substantially the same as a corresponding size of the FFC.

14. The LCD module of claim 10, wherein the circuit board is configured to convert a transistor-transistor logic (TTL) signal to an LVDS signal under control of a corresponding control signal, and the electric cable is configured to transmit the LVDS signal to the liquid crystal panel.

\* \* \* \* \*